_United States Patent_ [19]

Yumitori et al.

[11] Patent Number: 5,471,425
[45] Date of Patent: Nov. 28, 1995

[54] DYNAMIC RANDOM ACCESS MEMORY HAVING SENSE AMPLIFIER CONTROL CIRCUIT SUPPLIED WITH EXTERNAL SENSE AMPLIFIER ACTIVATING SIGNAL

[75] Inventors: Fuminori Yumitori; Yasuhiro Fujii, both of Kawasaki, Japan

[73] Assignee: Fujitsu Limited, Kawasaki, Japan

[21] Appl. No.: 186,609

[22] Filed: Jan. 26, 1994

[30] Foreign Application Priority Data

Mar. 10, 1993 [JP] Japan .................... 5-049379

[51] Int. Cl.⁶ .................................................. G11C 7/00
[52] U.S. Cl. .................. 365/190; 365/230.03; 365/233; 365/189.09
[58] Field of Search .................................. 365/190, 205, 365/230.03, 233, 233.5, 189.09

[56] References Cited

U.S. PATENT DOCUMENTS

| | | | |
|---|---|---|---|
| 4,984,210 | 1/1991 | Kumanoya et al. | 365/222 |
| 5,132,932 | 7/1992 | Tobita | 365/222 |
| 5,251,180 | 10/1993 | Ohshima | 365/230.03 |
| 5,267,203 | 11/1993 | Hwang et al. | 365/190 |
| 5,319,253 | 6/1994 | You | 307/265 |

_Primary Examiner_—David C. Nelms
_Assistant Examiner_—Andrew Q. Tran
_Attorney, Agent, or Firm_—Staas & Halsey

[57] ABSTRACT

The present invention relates to a high-speed data transmission system for efficiently transmitting large amounts of data within short periods of time. A DRAM comprises at least a memory cell, sense amplifiers, a /RAS signal input, a word line (WL) boost signal generator, a sense amplifier control signal-generator, and a sense amplifier drive signal-generator, wherein the memory cell is constituted by a plurality of banks, the sense amplifiers are provided in a corresponding plurality of numbers, the sense amplifier control signal-generator are provided in a plurality of numbers to correspond to the plurality of banks, and provision is made of external sense amplifier activating signal terminals which are connected to the sense amplifier control signal-generator in order to activate the sense amplifiers independently of the /RAS signal.

6 Claims, 16 Drawing Sheets

DYNAMIC RANDOM ACCESS MEMORY HAVING SENSE AMPLIFIER CONTROL CIRCUIT SUPPLIED WITH EXTERNAL SENSE AMPLIFIER ACTIVATING SIGNAL

BACKGROUND OF THE INVENTION

1. Field of the Invention

The present invention relates to a sense amplifier control circuit and to a sense amplifier control method. More specifically, the invention relates to technology for controlling the activation of sense amplifiers in a dynamic random access memory (hereinafter referred to as DRAM) having a bank system.

2. Description of the Related Art

The trend toward higher operation speeds of arithmetic units (CPUs) has urged manufacturers to develop DRAM technology for transmitting data at high speeds.

In a conventional high-speed data processing and transmitting system, in general, a word line (WL) in the DRAM is activated by a row address strobe signal (hereinafter referred to as /RAS signal), and a sense amplifier activating signal activates the sense amplifier in synchronism with the /RAS signal after a suitable delay time by which the word line (WL) assumes a sufficiently large level due to the /RAS signal.

FIG. 12 is a block diagram explaining a circuit for executing a function for activating word lines (WL) in the DRAM and a function for activating sense amplifiers according to a prior art. In FIG. 12, the sense amplifier control circuit 100 is constituted by a /RAS signal processing circuit 1 that inputs a /RAS signal, a word line (WL) boost signal-generating circuit 2 which receives an output from the /RAS signal processing circuit 1 and outputs a control signal to a word line (WL) predecoder circuit 3 in response to the /RAS signal, a word line (WL) main decoder circuit 4 which receives an output from the word line (WL) predecoder circuit 3 and selects activation or de-activation of a predetermined word line (WL), a sense amplifier control signal-generating means 5 which generates a control signal for controlling the sense amplifier in response to the output of the word line (WL) boost signal-generating circuit 2, a bit line reset signal-generating circuit 6 that resets a bit line in response to an output of the sense amplifier control signal-generating means 5, and a sense amplifier drive signal-generating means 7 which outputs a sense amplifier activating signal. The basic operation of the sense amplifier control circuit 100 is as described below. That is, as shown in the waveform diagram of FIG. 13, the selected word line (WL) is activated at the down edge of the /RAS signal, and the sense amplifier drive signal-generating means 7 outputs an internal sense amplifier activating signal after the passage of a predetermined delay time that is set by taking into consideration the time by which the above word line (WL) is raised sufficiently to activate the sense amplifier.

In order to read the data in the sense amplifier, the bit line must have been reset prior to activating the word line (WL). Even in the prior art, therefore, a reset signal for resetting the bit line is output from the bit line reset signal-generating circuit 6 in synchronism with the break of the /RAS signal.

Then, as the /RAS signal rises, the word line (WL) is de-activated in synchronism therewith, and the sense amplifier is de-activated in synchronism therewith, whereby the bit line reset signal is no longer produced.

That is, according to the prior art, activation of the word line (WL) and activation of the sense amplifier are controlled by the same /RAS signal at all times. Therefore, when the /RAS signal is de-activated, both the word line (WL) and the sense amplifier are de-activated, and, hence, the data that is once selected is readily output in response to a suitable column address signal or is erased as the /RAS signal is de-activated. Even when it is desired to read related data, therefore, the row and column must be selected again using another /RAS signal, requiring extended periods of time for transmitting the data.

As the arithmetic units are operated at higher speeds, the above problem becomes important. When it is attempted to realize a high-speed DRAM technology, the above-mentioned conventional data transmission technology is no longer useful.

SUMMARY OF THE INVENTION

The object of the present invention is to provide a high-speed data transmission system which efficiently transmits large amounts of data within short periods of time by solving the problem inherent in the prior art. More concretely speaking, the present invention provides a circuit for controlling sense amplifiers and a method of controlling sense amplifiers for realizing the aforementioned high-speed data transmission system.

In order to accomplish the above-mentioned object, the present invention employs technical constitution that is described below. That is, according to a first embodiment of the present invention, there is provided a dynamic random access memory (DRAM) comprising: a plurality of memory cells selected by the word lines and the bit lines; sense amplifiers connected to each one of the bit lines; a word line (WL) boost signal-generating circuit for actuating at least one of the word lines, in response to an input of a row address strobe (/RAS) signal; and a sense amplifier control signal-generating circuit to control the sense amplifier so as to actuate or deactuate thereof, in response to the row address strobe (/RAS) signal and an external sense amplifier activating signal output from an external sense amplifier activating signal generating circuit.

According to a second embodiment of the present invention, there is provided a dynamic random access memory (DRAM) comprising: a plurality of memory cells selected by the word lines and the bit lines; sense amplifiers connected to each one of the bit lines; a word line (WL) boost signal-generating circuit for actuating at least one of the word lines by one shot pulse in synchronism with the rising and breaking edges of each one of a plurality of row address strobe (/RAS) signals; and a sense amplifier control signal-generating circuit to control the sense amplifier so as to actuate or deactuate thereof, in synchronism with the row address strobe (/RAS) signals.

According to a third embodiment of the present invention, there is provided a A dynamic random access memory (DRAM) comprising: a plurality of memory cells selected by the word lines and the bit lines; sense amplifiers connected to each one of the bit lines; a word line (WL) boost signal-generating circuit for actuating at least one of the word lines by a one shot pulse in synchronism with the rising and breaking edges of each one of a plurality of row address strove (/RAS) signals; and a sense amplifier control signal-generating circuit is so constituted as to activate the sense amplifiers in synchronism with the bank address signals that are derived from the row address strobe (/RAS) signal.

According to a specific feature of the first embodiment of the present invention, there is provided a sense amplifier control circuit in a dynamic random access memory (DRAM) which comprises at least a memory cell means, sense amplifiers, a /RAS signal input means, a word line (WL) boost signal-generating means, a sense amplifier control signal-generating means and a sense amplifier drive signal-generating means, and which reads cell data by activating the word lines (WL) by utilizing row address strobe (/RAS) signals, wherein said memory cell means is constituted by a plurality of banks, said sense amplifier control signal-generating means are provided in a plurality of numbers to correspond to the plurality of banks, and provision is made of an external sense amplifier activating signal means which is connected to said sense amplifier control signal-generating means in order to activate the sense amplifiers independently of the /RAS signals.

According to a specific feature of the second embodiment of the present invention, there is provided a sense amplifier control circuit in a dynamic random access memory (DRAM) which comprises at least a memory cell means, sense amplifiers, a /RAS signal input means, a word line (WL) boost signal-generating means, a sense amplifier control signal-generating means and a sense amplifier drive signal-generating means, and which reads cell data by activating the word lines (WL) by utilizing row address strobe (/RAS) signals, wherein said memory cell means is constituted by a plurality of banks, said sense amplifier control signal-generating means are provided in a plurality of numbers to correspond to the plurality of banks, said /RAS signals are formed in a plurality of numbers to correspond to the plurality of banks, said word line (WL) boost signal-generating means is so constituted as to activate the word lines (WL) by one shot pulse in synchronism with the rising and falling edges of the /RAS signals, and said sense amplifier control signal-generating means is so constituted as to activate the sense amplifiers in synchronism with the /RAS signals.

According to a specific feature of the third embodiment of the present invention, there is provided a sense amplifier control circuit in a dynamic random access memory (DRAM) which comprises at least a memory cell means, sense amplifiers, a /RAS signal input means, a word line (WL) boost signal-generating means, a sense amplifier control signal-generating means and a sense amplifier drive signal-generating means, in order to read cell data by activating the word lines (WL) by utilizing row address strobe (/RAS) signals, wherein said memory cell means is constituted by a plurality of banks, said sense amplifier control signal-generating means are provided in a plurality of numbers to correspond to the plurality of banks, said word line (WL) boost signal-generating means is so constituted as to activate the word lines (WL) by one shot pulse in synchronism with the rising and falling edges of the /RAS signals, and said sense amplifier control signal-generating means is so constituted as to activate the sense amplifiers in synchronism with bank address signals that are derived from said /RAS signals.

In the sense amplifier control circuit in a DRAM which employs a bank system using a plurality of banks according to the present invention as described above, the circuit for activating the word lines (WL) in the DRAM is commonly used, and the word line (WL) activating function and the sense amplifier activating function are so constituted that they will be driven independently of each other. Therefore, the sense amplifier activating function is activated without being controlled by a predetermined /RAS signal and, as required, the sense amplifier activating function is maintained in the activated condition to hold the necessary data.

When the same data or the data having a predetermined relationship to the above data are to be read out, therefore, the time for executing the arithmetic processing can be greatly shortened.

That is, according to the present invention, the sense amplifier activating signal means is maintained in the active condition even when the word lines (WL) are in the de-activated condition due to the de-activated /RAS signal. Therefore, the time can be shortened when the data in the same bank are to be read out again, i.e., when a group of data that have been stored are to be read out again, enabling large amounts of data to be transmitted at high speeds.

Furthermore, according to the present invention which uses a plurality of banks, it is allowed to maintain a bank activated, i.e., to maintain predetermined data while exchanging data with other banks. It is further allowed to extend the period for activating the sense amplifiers up to a period which is equal to a maximum refreshing time in the DRAM, giving a margin to the arithmetic processing operation.

DETAILED DESCRIPTION OF THE PREFERRED EMBODIMENTS

Embodiments of the sense amplifier control circuit according to the present invention will now be described in detail with reference to the drawings.

In order to develop a new data transmission system which meets the demand by improving defects inherent in the above-mentioned prior art, a new technology has been proposed by incorporating a bank system in the data transmission system that uses sense amplifiers of a conventional DRAM.

Employment of the bank system makes it possible to execute the operation of reading/writing large amounts of data within short periods of time.

That is, large amounts of data are output in parallel within short periods of time, and are subjected to the parallel-serial conversion to transmit the data at high speeds. Here, employment of the bank system makes it possible to execute access maintaining further improved efficiency.

In the DRAM based upon the conventional bank system, however, the bank control or the sense amplifier activation processing is carried out together with the word line (WL) activation processing which is based upon the /RAS signal without any degree of freedom and, hence, making it difficult to efficiently access large amounts of data.

According to the present invention in which the word line (WL) activating function and the external sense amplifier activating function operate independently from each other as described above, the word line (WL) may be activated or de-activated depending upon the /RAS signal, but the sense amplifier is allowed to hold predetermined data for a predetermined period of time even when the word line (WL) is de-activated since the sense amplifier activating signal is capable of maintaining the activated condition. Therefore, when the predetermined data is selectively read out from a given bank followed by the reading of other data from the same bank, there is no need of making access to row addresses but access can be simply made to column addresses only, making it possible to greatly shorten the access time.

A first embodiment according to the present invention will now be described.

Figure 1:
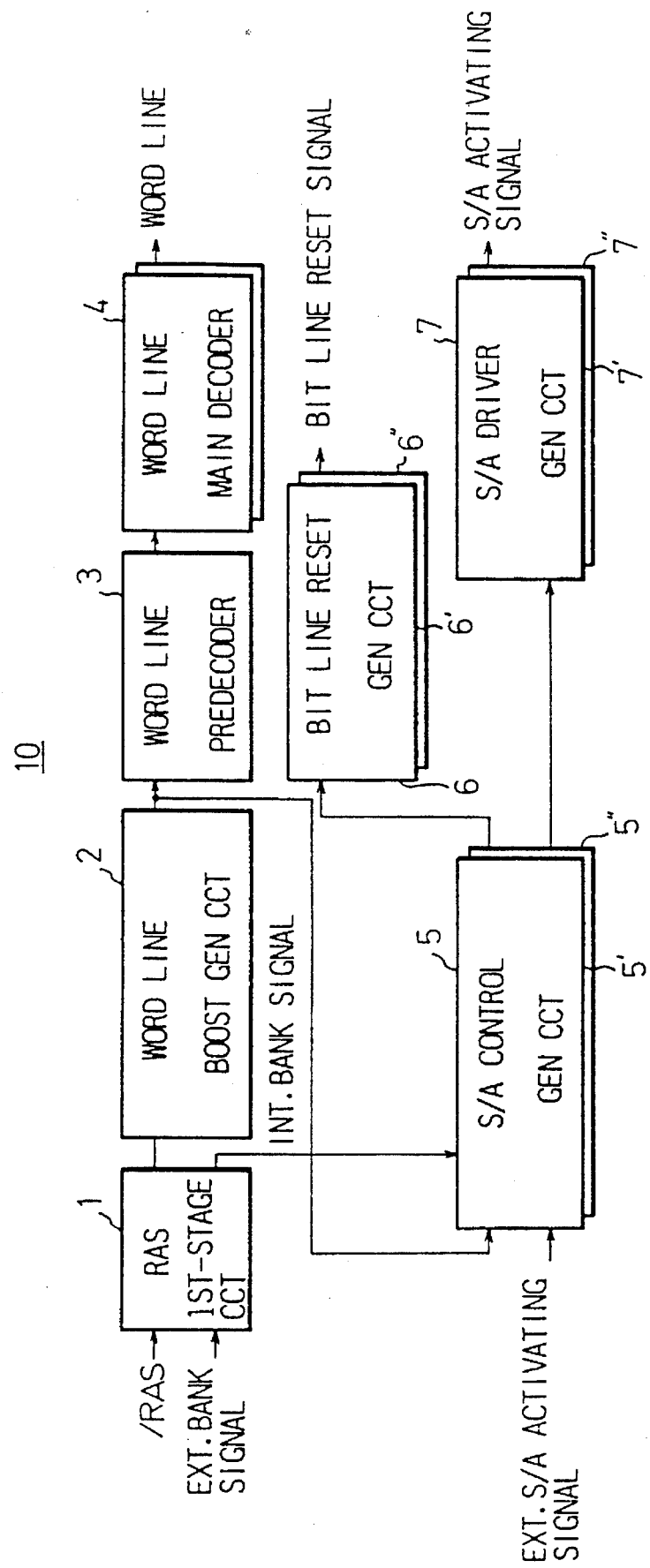
FIG. 1 is a block diagram illustrating a sense amplifier control circuit according to a first embodiment of the present invention.
Figure 2:
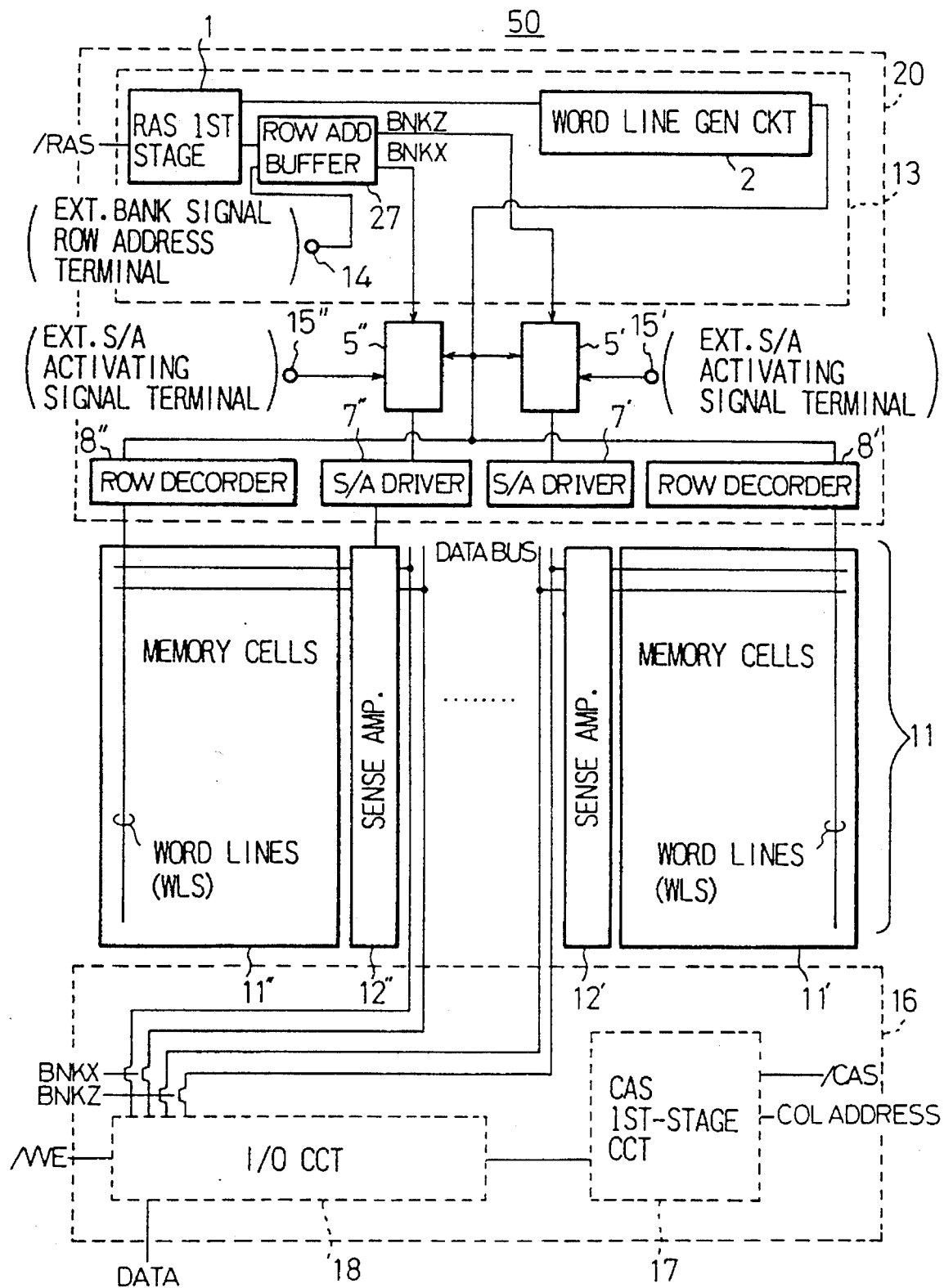
FIG. 2 is a block diagram illustrating the whole constitution of the sense amplifier control circuit according to the first embodiment of the present invention.

FIGS. 1 and 2 are block diagrams illustrating a sense amplifier control circuit 10 according to the first embodiment of the present invention. That is, in a dynamic random access memory (DRAM) which comprises at least a memory cell means 11, sense amplifiers 12, a /RAS signal input means 1, a word line (WL) boost signal-generating means 2, a sense amplifier control signal-generating means 5 and a sense amplifier drive signal-generating means 7, in order to read cell data by activating the word lines (WL) by utilizing row address strobe (/RAS) signals, a sense amplifier control circuit wherein said memory cell means 11 is constituted by a plurality of banks 11', 11", said sense amplifiers are provided in a corresponding plurality of numbers 12', 12", said sense amplifier control signal-generating means 5 are provided in a plurality of such amplifiers 5', 5" to correspond to the plurality of banks 11', 11", and provision is made of external sense amplifier activating signal terminals 15', 15" which are connected to said sense amplifier control signal-generating means 5', 5" in order to activate the sense amplifiers 12', 12" independently of the /RAS signals.

Figure 12:
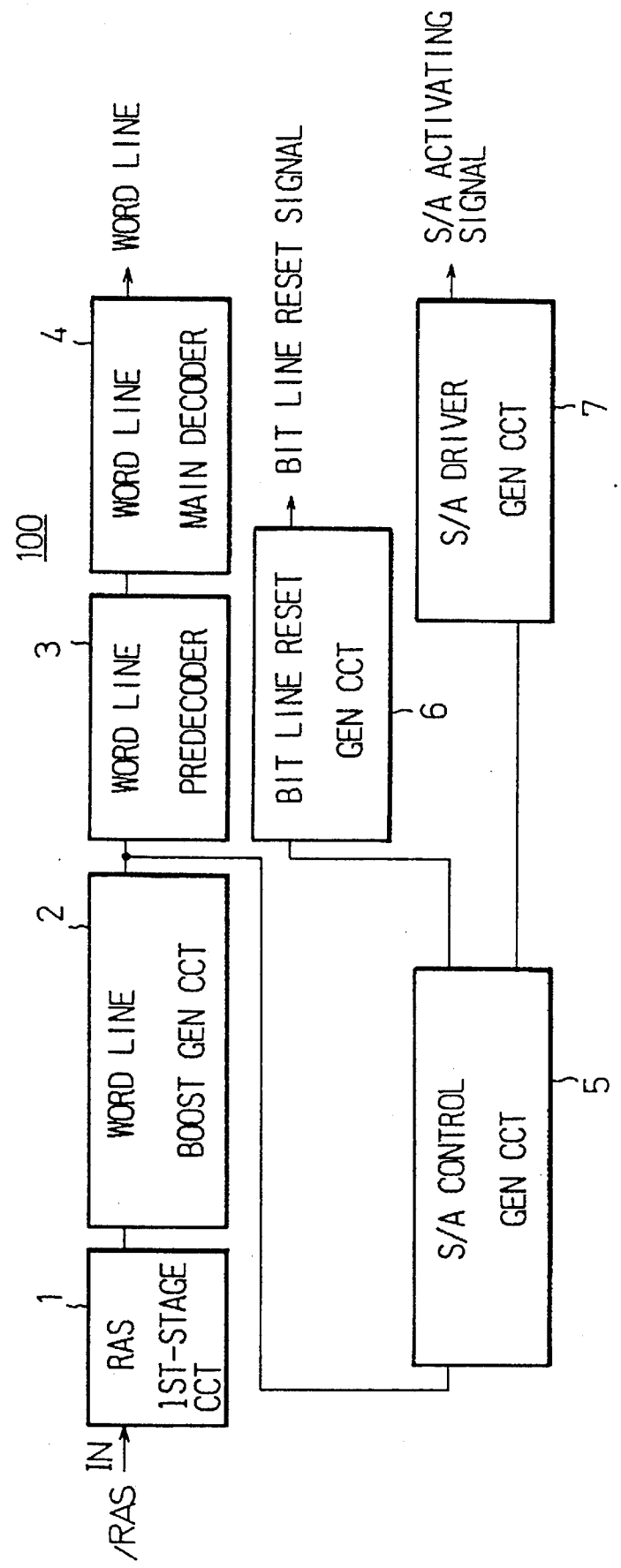
FIG. 12 is a block diagram illustrating a conventional sense amplifier control circuit.
Figure 13:
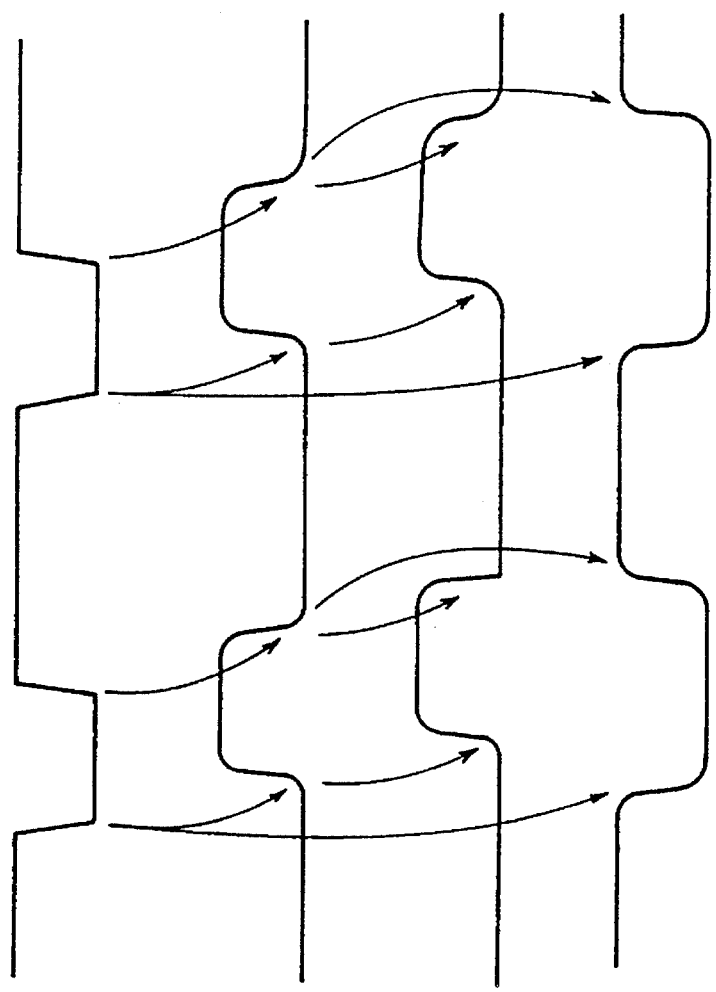
FIGS. 13A–13D is a diagram of waveforms illustrating the operation of the conventional sense amplifier control circuit.

FIG. 1 is a block diagram illustrating the constitution of the above-mentioned sense amplifier control circuit 10 according to the present invention, wherein the same constituent elements as those of FIG. 12 are denoted by the same reference numerals as those of FIG. 12.

FIG. 2 is a block diagram which schematically illustrates the whole system constitution of the sense amplifier control circuit 10 according to the first embodiment of the present invention shown in FIG. 1.

In the sense amplifier control circuit 10 according to the first embodiment of the present invention as will be comprehended from FIG. 2, a column address control circuit 16 is provided separately from that of the /RAS signal system, the column address control circuit 16 being provided, for example, with a column address signal input circuit 17 and a suitable input/output circuit (I/O CCT) 18.

That is, as shown in FIG. 2, the sense amplifier control circuit 10 according to the present invention is constituted by a RAS circuit 20, a memory circuit 11 made up of a plurality of banks 11', 11" and sense amplifiers 12', 12" corresponding to the banks 11', 11", and a column address control circuit 16. The RAS circuit 20 is constituted by a RAS first-stage circuit 13, a first sense amplifier control signal-generating circuit 5', a second sense amplifier control signal-generating circuit 5", a first row decoder 8' that controls the first bank 11', a first sense amplifier drive signal-generating circuit 7' that controls the first sense amplifier 12', a second row decoder 8" that controls the second bank 11", and a second sense amplifier drive signal-generating circuit 7" that controls the second sense amplifier 12".

In the RAS first-stage circuit 13 in the sense amplifier control circuit 10 according to the first embodiment of the present invention, there is provided a RAS signal first-stage input circuit 1 as a /RAS signal input means 1 and an external bank signal row address input terminal 14 that determines which one of the plurality of banks is to be selected, and wherein an external bank signal row address signal and an output of the RAS signal first-stage input circuit 1 are input to a row address buffer 27, and predetermined internal bank signals BNKX and BNKZ are output from the row address buffer 27 and are separately input to the first and second sense amplifier control signal-generating means 5' and 5".

The external bank signal according to the present invention is an address signal of the bank which may be the same as the /RAS signal.

By using the external bank signal, it is allowed to latch the data of a predetermined bank and to hold the latched data for a predetermined period of time irrespective of whether the /RAS signal is activated or de-activated.

The characteristic technical constitution according to the first embodiment of the present invention resides in that provision is made of the first and second sense amplifier control signal-generating means 5' and 5", and the first and second sense amplifier drive signal-generating means 7', 7" are selected in order that a predetermined bank is activated by the sense amplifier control signal-generating means 5', 5" in response to the predetermined internal bank signals BNKX and BNKZ, first external sense amplifier activating signal terminal 15' and second external sense amplifier activating signal terminal 15".

The external sense amplifier activating signal that is input to the external sense amplifier activating signal terminal may be input from a suitable external circuit or may be the one that is generated in synchronism with the /RAS signal. Or, the /RAS signal may be directly utilized.

According to the present invention, the external sense amplifier activating signal behaves in the selected bank differently from the activation or the de-activation of the /RAS signal and maintains the sense amplifier in the active condition even when the word line (WL) is de-activated. Thus, the sense amplifier in the bank is maintained activated independently of the /RAS signal.

Though the above description has dealt with the sense amplifier control circuit 10 in which the two banks are constituted by dividing the memory cells into two regions, it should be noted that the invention is in no way limited to the above embodiment only but encompasses the cases where the memory cells are divided into a plurality of regions greater than two to constitute banks of a number of greater than two. It need not be pointed out that in these cases, the aforementioned constituent elements such as the sense amplifier control signal-generating means 5, external sense amplifier activating signals, sense amplifier drive signal-generating means 7, bit line-resetting means 6 and the like are provided in a number that corresponds to the number of the banks.

In the sense amplifier control circuit 10 according to the present invention, there are provided a plurality of banks which are constituted by a plurality of memory blocks of, for example, 256 k, and any one of them is selected by the external bank signal and is activated by a predetermined logic and the external sense amplifier activating signal.

In the present invention, the bank is selected, and the predetermined data are stored, held, calculated and transmitted as a group.

Figure 3:
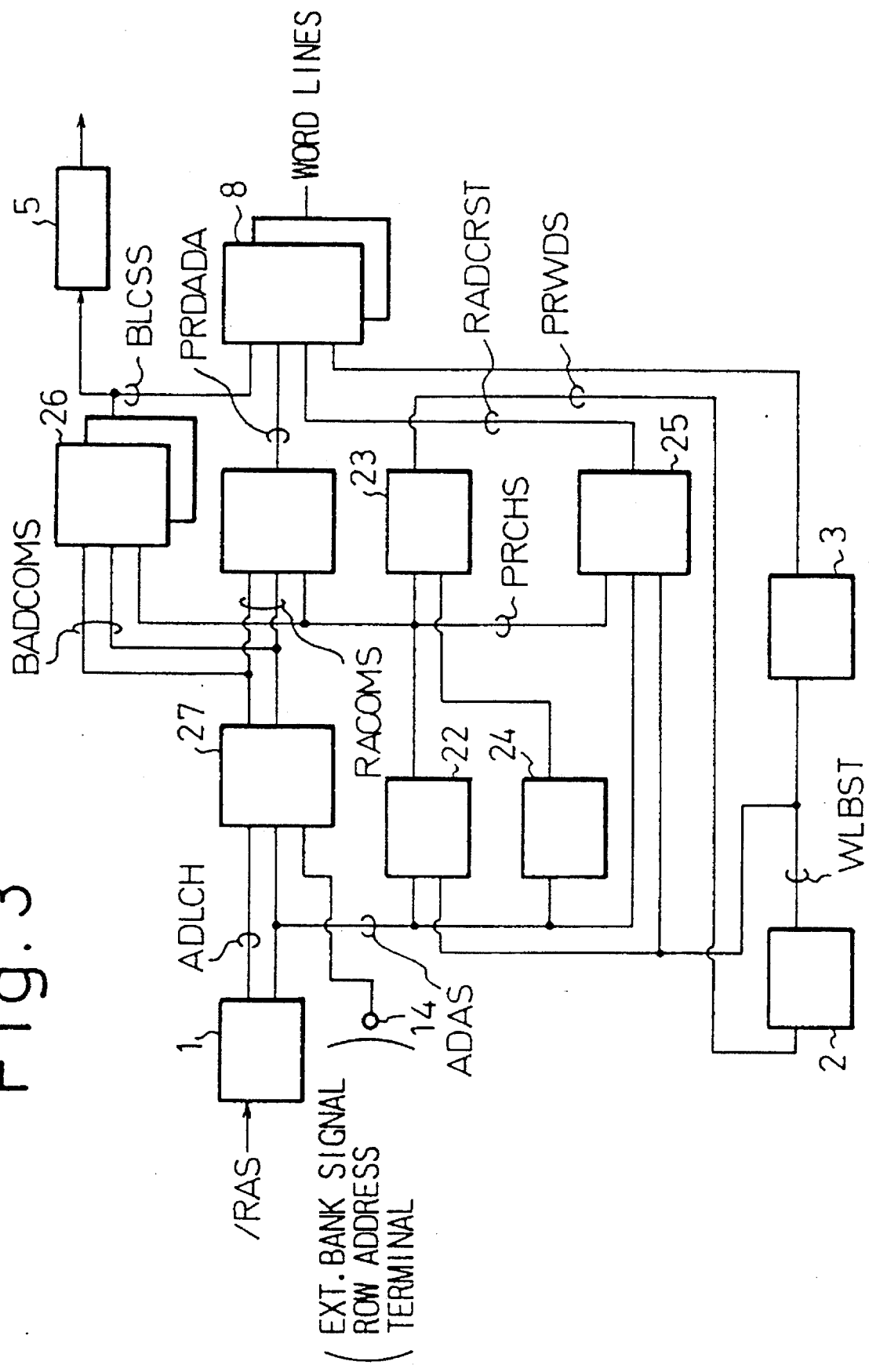
FIG. 3 is a block diagram illustrating a RAS initial-stage circuit used in the sense amplifier control circuit according to the first embodiment of the present invention.

Described below with reference to a block diagram of FIG. 3 is the concrete constitution of the RAS first-stage circuit 13 in the sense amplifier control circuit 10 according to the first embodiment of the present invention.

That is, the RAS input first-stage circuit 1 which inputs the /RAS signal outputs an address latch signal ADLCH and an address activating signal ADAS which are then input to the row address buffer circuit 27 that is receiving the external bank signal.

On the other hand, the address activating signal ADAS output from the RAS input first-stage circuit is input to a precharge signal-generating circuit 22 and to a word driver generating circuit 24 whose outputs are input to a preword driver generating circuit 23.

To the precharge signal-generating circuit 22 is also fed an output of a word line boost generating circuit 2 which will be described later. A precharge signal PRCHS is output from the precharge signal-generating circuit 22 based upon the logic of the address activating signal ADAS and the output of the word line boost generating circuit 2.

The row address buffer circuit 27 outputs bank address complementary signals BADCOMS (e.g., BNKX, BNKZ, etc.) which are fed to the row predecoder 21 and to the plurality of block select decoders 26, respectively. The precharge signal PRCHS output from the precharge signal generating circuit 22 is also input to the row predecoder 21 and to the block select decoder 26.

As a result, the row predecoder 21 outputs a predecoder address signal PRDADD to the main row decoder 8 which then outputs a word line (WL) activating signal. Then, the block select decoders 26 output block select signals BLCSS which are fed to the main row decoder 8.

On the other hand, the preword driver generating circuit 23 outputs a preword driver signal PRWDS which is input to the above-mentioned word line boost generating circuit 2.

In response to the preword driver signal PRWDS, the word line boost generating circuit 2 outputs a word line boost signal WLBST which is input to the precharge signal generating circuit 22 as described above and is, at the same time, input to the row predecoder circuit 3. The output of the row predecoder circuit 3 is input to the main row decoder 8.

Provision is further made of a row decoder reset generating circuit 25 which receives the precharge signal PRCHS output from the precharge signal-generating circuit 22, the address activating signal ADAS and the word line boost signal WLSBT. The row decoder reset signal RDCRST output from the row decoder reset generating circuit 25 is input to the main row decoder 8.

The block select signals BLCSS output from the block select decoders 26 are fed to the sense amplifier control signal-generating means 5.

Figure 4:
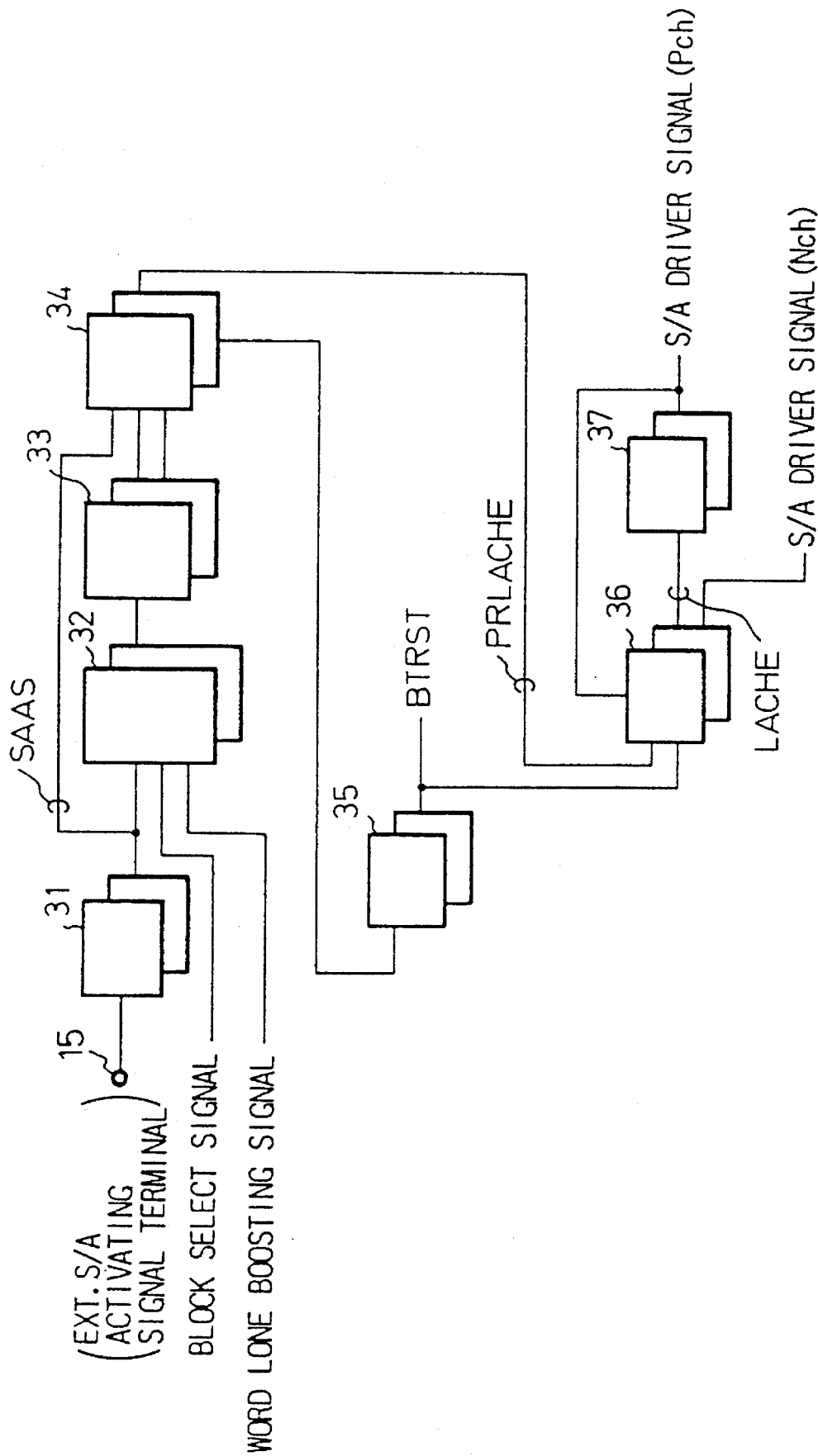
FIG. 4 is a block diagram illustrating a sense amplifier control signal-generating circuit used in the sense amplifier circuit according to the first embodiment of the present invention.

FIG. 4 is a block diagram which illustrates the concrete constitution of the sense amplifier control signal-generating means 5 according to the first embodiment of the present invention, wherein the circuits constituting the sense amplifier control signal-generating means 5 are each provided in a plurality of numbers to correspond to the number of the banks.

First, the external sense amplifier activating signal is input to a sense amplifier enable buffer 31 to generate a sense amplifier activating signal SAAS which is then input to the sense amplifier enable generating circuit 32.

The sense amplifier enable generating circuit 32 further receives block select signals BLCSS output from the block select decoders 26 and the word line boost signal WLBST.

The sense amplifier enable generating circuit 32 sends an output that responds to the input signals having a certain logic, to a timing word line generating circuit 33 which then sends an output to a prelatch enable generating circuit 34.

The prelatch enable generating circuit 34 further receives the sense amplifier activating signal SAAS output from the sense amplifier enable buffer 31, and outputs a prelatch enable signal PRLACHE in response to the logic of the above two signals. The prelatch enable signal PRLACHE is input to the sense amplifier driver generating circuit 36. The other output of the prelatch enable generating circuit 34 is input to a bit line reset generating circuit 35 which outputs a bit line reset signal BTRST that will be input to the sense amplifier driver generating circuit 36.

As a result, the sense amplifier driver generating circuit 36 outputs a sense amplifier driver signal (for N channel), a sense amplifier driver signal (for P channel) and a latch enable signal LACHE. The latch enable signal LACHE is input to the sense amplifier driver generating circuit 37 which outputs a sense amplifier driver signal (for P channel).

Operation of the sense amplifier control circuit 10 according to the first embodiment of the present invention will now be described with reference to FIG. 5.

Figure 5:
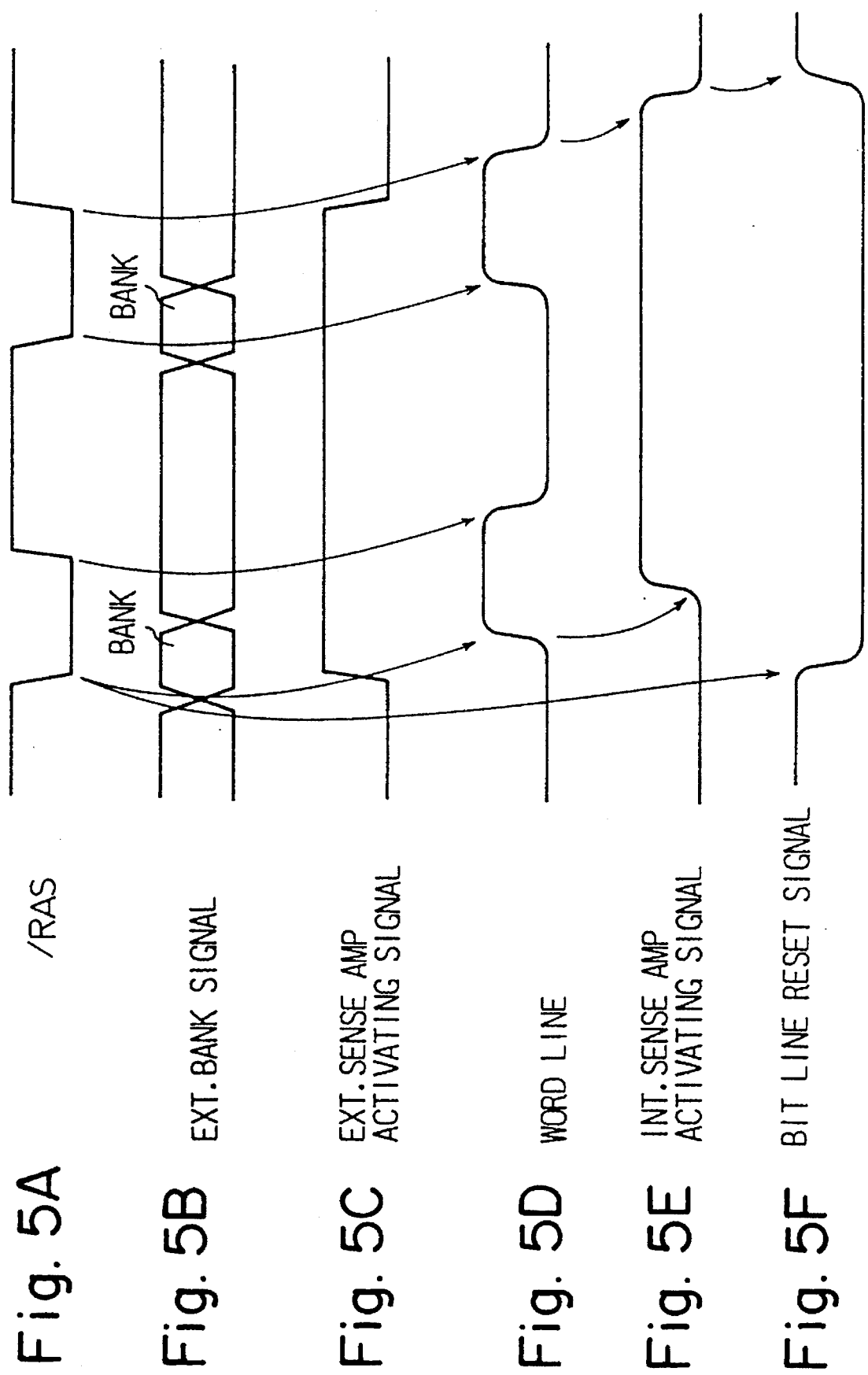
FIGS. 5A–5F is a diagram of waveforms illustrating the operation of the sense amplifier control circuit according to the first embodiment of the present invention.

FIG. 5 is a diagram of waveforms for explaining the driving condition of the major portion of the sense amplifier control circuit 10 of the present invention, wherein in response to the fall of the /RAS signal (activation of /RAS signal), the external bank signal reads and latches an address n for selecting a predetermined bank.

A specified bank is selected in response to the latched data and data of this bank only is read out.

In other banks, the data selected at a previous moment are held.

As the external sense amplifier activating signal terminal 15 rises in synchronism with the fall of the /RAS signal, furthermore, the bit line reset signal resets a bit line that corresponds to the bank.

On the other hand, the word line (WL) is raised after a predetermined delay time after the fall of the /RAS signal prior to receiving the internal sense amplifier activating signal, i.e., prior to receiving the output of the sense amplifier control signal-generating means 5.

Here, the internal sense amplifier activating signal is raised based upon the logic of the /RAS signal and the external sense amplifier activating signal.

Therefore, even when the /RAS signal rises and the word line (WL) is de-activated in synchronism therewith, the internal sense amplifier activating signal holds the active condition.

Then, when the same external bank signal is selected and is latched in synchronism with the break of the /RAS signal, the predetermined data can be read out while making access to the column address since the internal sense amplifier activating signal has already been activated at the moment when the word line (WL) is raised.

That is, in this embodiment, the word line (WL) is activated by the fall of the /RAS signal. As the word line (WL) is activated by the logic of the external sense amplifier activating signal and the external bank signal, the internal sense amplifier activating signal is activated and the sense amplifier operates.

On the other hand, the word line (WL) is de-activated and is reset at the rise of the /RAS signal. When the external sense amplifier activating signal is in the active condition, however, the internal sense amplifier activating signal stores the data in the bit line, and the sense amplifier continues its operation.

Furthermore, the internal sense amplifier activating signal is de-activated after a predetermined delay time has passed from when the word line (WL) is de-activated at the rise of the /RAS signal and the external sense amplifier activating signal is de-activated.

Thus, the data can be held by the sense amplifier even when the word line (WL) is reset. Therefore, once access is made, the data is already held in the sense amplifier. Therefore, when the same address (word line (WL)) is to be selected next time, access needs simply be made to the column address contributing greatly to decreasing the access time.

In this case, a control circuit must be separately provided to compare the row addresses.

According to the embodiment of the present invention, furthermore, the period for activating the sense amplifier can be lengthened up to a time for refreshing the DRAM, i.e., up to a time necessary for refreshing all of the cells making it possible to impart a considerable margin to the access time.

According to the prior art, the sense amplifier could be activated only during the period in which the word line (WL) is raised. During the period in which the word line (WL) is raised, furthermore, the sense amplifier could usually be activated for a period of time shorter than the time for refreshing the cells, and access could be made for a short period of time.

According to the present invention, the period for activating the sense amplifier is lengthened to be equal to the refresh time. Therefore, the time in which access can be made is lengthened to about 160 times as long as the conventional time making it possible to effect an access maintaining margin.

The data are erased during the refreshing time. During this period, therefore, it is not allowed to make access to the column address. According to the present invention, however, the time for making access is increased and the refreshing time is decreased to a time interval as short as possible, so that the access operation can be reliably executed.

Described below is the sense amplifier control circuit according to a second embodiment of the present invention.

In the sense amplifier control circuit 10 according to the first embodiment of the present invention, an external sense amplifier activating signal is used to control the sense amplifier. According to the present invention, however, it is also allowable to control the banks by forming the /RAS signals in a plurality of numbers that correspond to the number of the banks and by selectively using them, instead of using the external sense amplifier activating signal.

Figure 6:
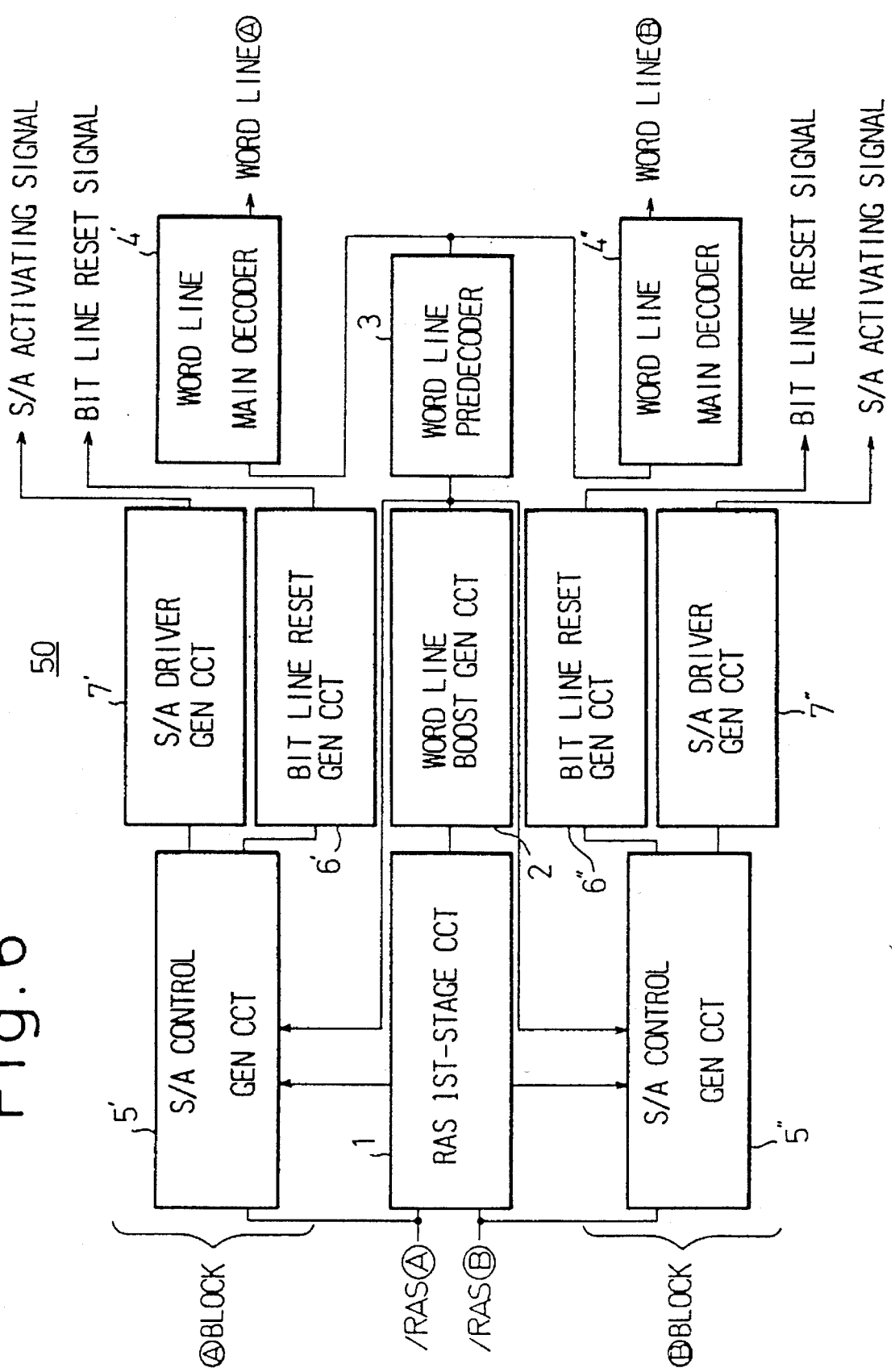
FIG. 6 is a block diagram illustrating the sense amplifier control circuit according to a second embodiment of the present invention.
Figure 7:
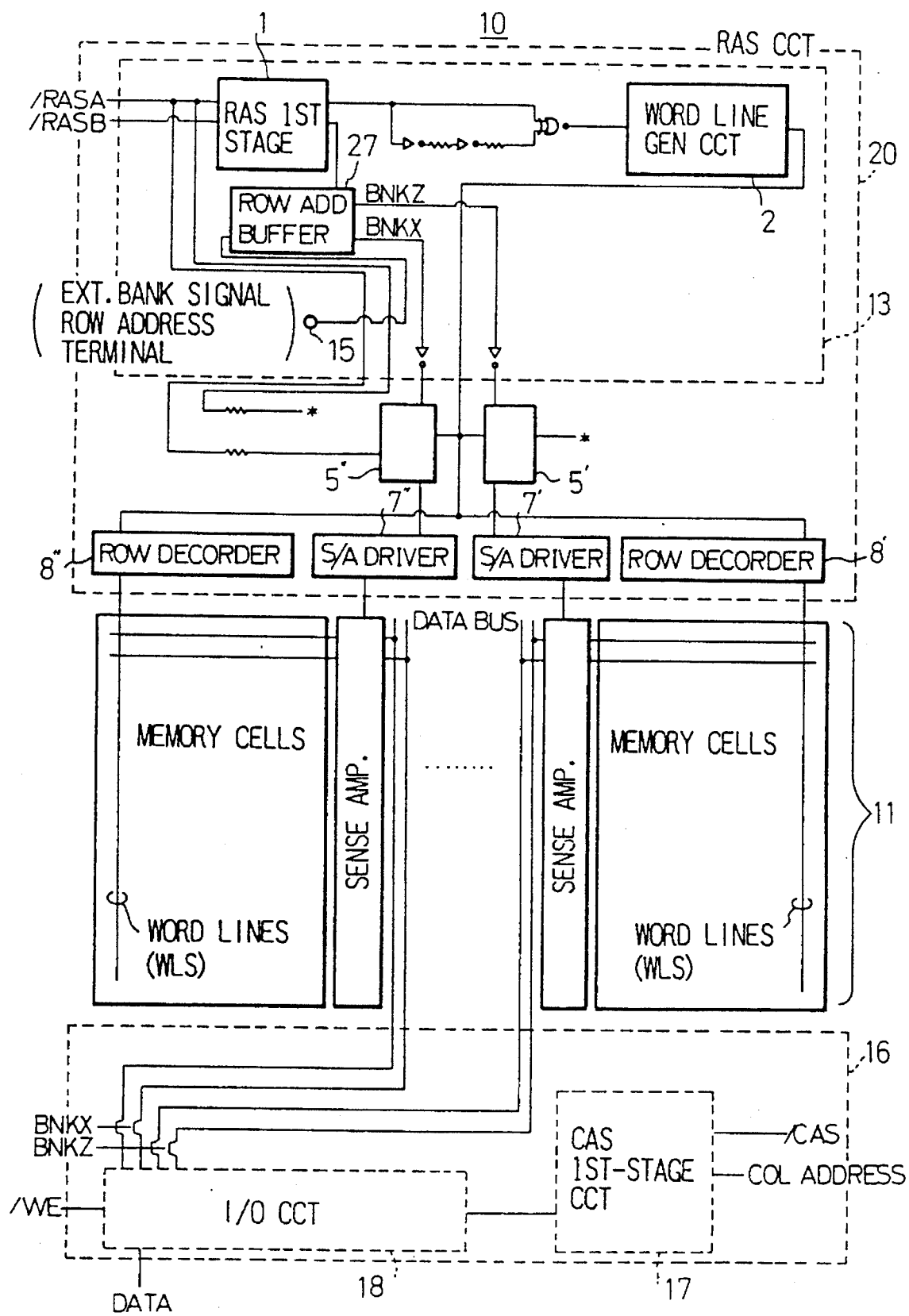
FIG. 7 is a block diagram illustrating the whole constitution of the sense amplifier control circuit according to the second embodiment of the present invention.

That is, as shown in the block diagrams of FIGS. 6 and 7, the second embodiment of the present invention is concerned with a sense amplifier control circuit 50 in a dynamic random access memory (DRAM) which comprises at least a memory cell means 11, sense amplifiers 12, a /RAS signal input means 1, a word line (WL) boost signal-generating means 2, a sense amplifier control signal-generating means 5 and a sense amplifier drive signal-generating means 7, in order to read cell data by activating the word lines (WL) by utilizing row address strobe (/RAS) signals, wherein said memory cell means 11 is constituted by a plurality of banks 11', 11", said sense amplifiers are provided in a plurality of numbers 12', 12", said sense amplifier control signal-generating means 5 are provided as a plurality of such elements 5', 5" to correspond to the plurality of banks 11', 11", said /RAS signals are formed in a plurality of numbers (/RAS (A) signals and /RAS (B) signal) to correspond to the plurality of banks 11', 11", and said word line (WL) boost signal-generating means 2 is so constituted as to activate the word lines (WL) by a one shot pulse in synchronism with the rising and falling edges of the /RAS signals (/RAS (A) signal and /RAS (B) signal).

That is, this embodiment employs the circuit constitution of different clock CLK signal systems, i.e., the (A) clock system and the (B) clock system, the constitution comprising the sense amplifier control signal-generating circuit 5', sense amplifier drive circuit 7' and bit line reset generating circuit 6' that are controlled by the /RAS (A) signal, and the sense amplifier control signal-generating circuit 5", sense amplifier drive circuit 7" and bit line reset generating circuit 6" that are controlled by the /RAS (B) signal, and between which are provided the RAS first-stage circuit 1 that receive the /RAS (A) signal and the /RAS (B) signal in common, the word line (WL) boost signal-generating means 2 connected in series therewith and the word line (WL) predecoder circuit 3, the output of the word line (WL) predecoder circuit 3 being connected to the word line (WL) main decoder circuit 4' that is controlled by the /RAS (A) signal to control the word line (WL) (A) and to the word line (WL) main decoder circuit 4" that is controlled by the /RAS (B) signal to control the word line (WL) (B).

In the sense amplifier control circuit 50 according to the second embodiment of the present invention, as will be understood from FIG. 7, the column address control circuit 16 is provided separately from the /RAS signal system, the column address control circuit 16 including a column address signal input means 17, and a suitable input/output circuit (I/O circuit) 18.

That is, the sense amplifier control circuit 10 according to the present invention is constituted, as shown in FIG. 7, by the RAS circuit 20, the memory circuit 11 made up of a plurality of banks 11', 11" and sense amplifiers 12', 12" corresponding to the banks 11', 11", and the column address control circuit 16. Moreover, the RAS circuit 20 is constituted by the RAS first-stage circuit 13, first sense amplifier control signal-generating circuit 5', second sense amplifier control signal-generating circuit 5", first row decoder 8' that controls the first bank 11', first sense amplifier drive signal-generating circuit 7' that controls the first sense amplifier 12', second row decoder 8" that controls the second bank 11" and second sense amplifier drive signal-generating circuit 7" that controls the second sense amplifier 12".

The RAS first-stage circuit 13 in the sense amplifier control circuit 50 according to the second embodiment of the present invention includes a RAS signal first-stage input circuit 1 which receives different /RAS signals which are row address signals (referred to as /RAS (A) signal and /RAS (B) signal) for selecting the data that correspond to different banks, and further has a separate external bank signal row address input terminal 14 that determines which one should be selected out of the plurality of banks. The output of the external bank signal row address input circuit 14 and the output of the RAS signal first-stage input circuit 1 are input to the row address buffer 27 which outputs predetermined internal bank signals BNKX and BNKZ that will be separately input to the first and second sense amplifier control signal-generating means 5' and 5".

Other circuits, their connections and their functions are nearly the same as those of FIG. 1, and are not described here in detail.

Figure 8:
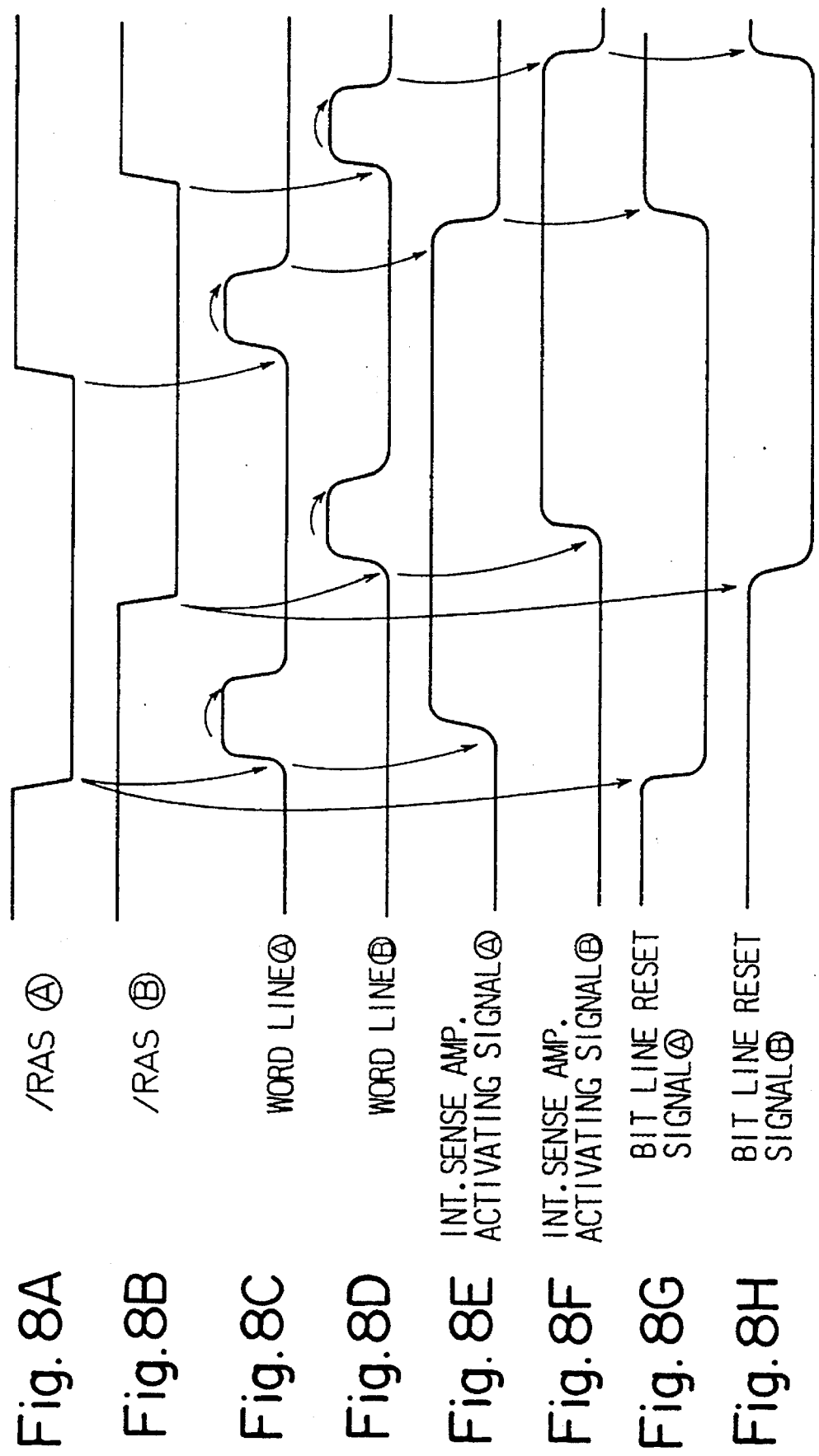
FIGS. 8A–8H is a diagram of waveforms illustrating the operation of the sense amplifier control circuit according to the second embodiment of the present invention.

FIG. 8 is a diagram of waveforms for explaining the driving condition of the major portion of the sense amplifier control circuit 50 according to the above-mentioned embodiment, wherein a specified bank is selected in response to the fall of the /RAS (A) signal (activation of the /RAS (A) signal), the word line (WL) (A) corresponding to the selected bank is activated by one shot pulse and, at the same time, a bit line reset signal (A) is output in synchronism with the break of the /RAS (A) signal in order to reset the bit line (A) that corresponds to the bank.

On the other hand, the internal sense amplifier activating signal (A) is activated, i.e., the sense amplifier control signal-generating means 5' is activated after a predetermined delay time has passed from when the word line (WL)(A) is activated, in synchronism with the break of the /RAS signal.

The internal sense amplifier activating signal is raised based on the logic of the /RAS signal and the external sense amplifier activating signal as in the first embodiment.

Therefore, even when the /RAS signal is raised and the word line (WL) is de-activated in synchronism therewith, the internal sense amplifier activating signal remains in the active condition.

Then, in synchronism with the break of the /RAS (A) signal, the word line (WL) (A) is activated again by the one shot pulse. The internal sense amplifier activating signal is de-activated after a predetermined delay time has passed from the break of the one shot pulse. During the period in which the internal sense amplifier activating signal is activated, the data read out from the predetermined bank is stored in the sense amplifier.

On the other hand, the specified bank is selected in response to the break of another /RAS (B) signal (activation of the /RAS (B) signal), and the word line (WL) (B) corresponding to the selected bank is activated by the one shot pulse and, at the same time, the bit line reset signal (B) is output in synchronism with the break of the /RAS (B) signal to reset the bit line (B) that corresponds to the bank.

On the other hand, the internal sense amplifier activating signal (B) is activated, i.e., the sense amplifier control signal-generating means 5" is activated after a predetermined delay time has passed from when the word line (WL) (B) is activated, in synchronism with the fall of the /RAS (B) signal.

Then, in synchronism with the fall of the /RAS (B) signal, the word line (WL) (B) is activated again by the one shot pulse, and the internal sense amplifier activating signal is de-activated after a predetermined delay time has passed from the fall of the one shot pulse. Here, during the period in which the internal sense amplifier activating signal is activated, the data read from the predetermined bank is held by the sense amplifier.

That is, in this embodiment, the word line (WL) (A) of the block (A) is activated at the fall of the /RAS (A) signal, and the sense amplifier of the block (A) is activated upon receipt of a logic of the /RAS (A) signal and the word line (WL) (A).

Similarly, the word line (WL) (B) of the block (B) is activated at the fall of the /RAS (B) signal, and the sense amplifier of the block (B) is activated in response to a logic caused by the /RAS (B) signal and the word line (WL) (B).

This constitution makes it possible to effect access to the block (B) while the sense amplifier in the block (A) is being activated. When it is attempted to effect access to the same row address (word line (WL)) of the block (A), the data is already held in the sense amplifier making it possible to shorten the access time.

The sense amplifier control circuit 60 according to a third embodiment of the present invention will be described next.

In the sense amplifier control circuits 10 and 50 of the aforementioned first and second embodiments, the bank including the sense amplifier is controlled by using the external bank signal or a plurality of /RAS signals. The present invention, however, is in no way limited to such embodiments only but also makes it possible to control the banks relying upon the bank addresses only as a method of controlling the sense amplifier.

This embodiment will now be described with reference to FIGS. 9 and 10.

Figure 9:
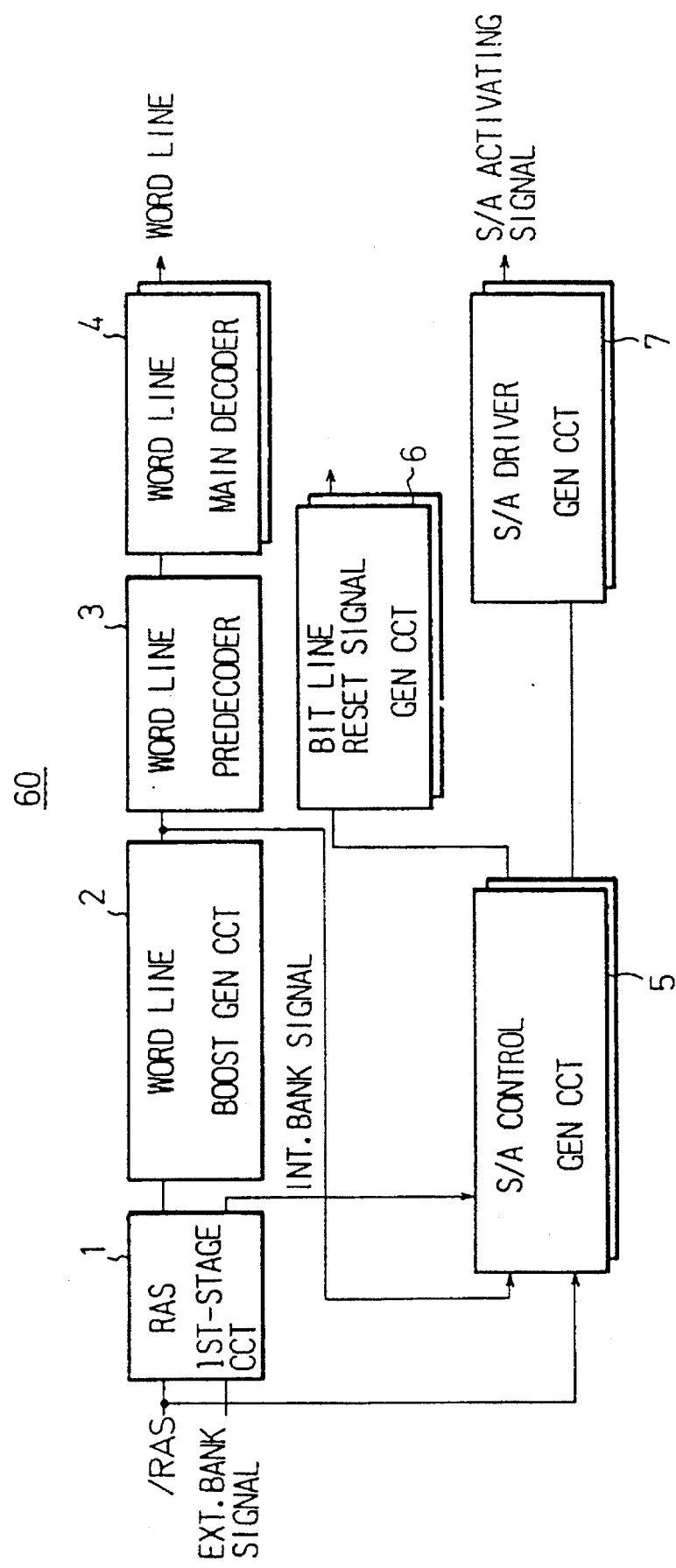
FIG. 9 is a block diagram illustrating the sense amplifier control circuit according to a third embodiment of the present invention.
Figure 10:
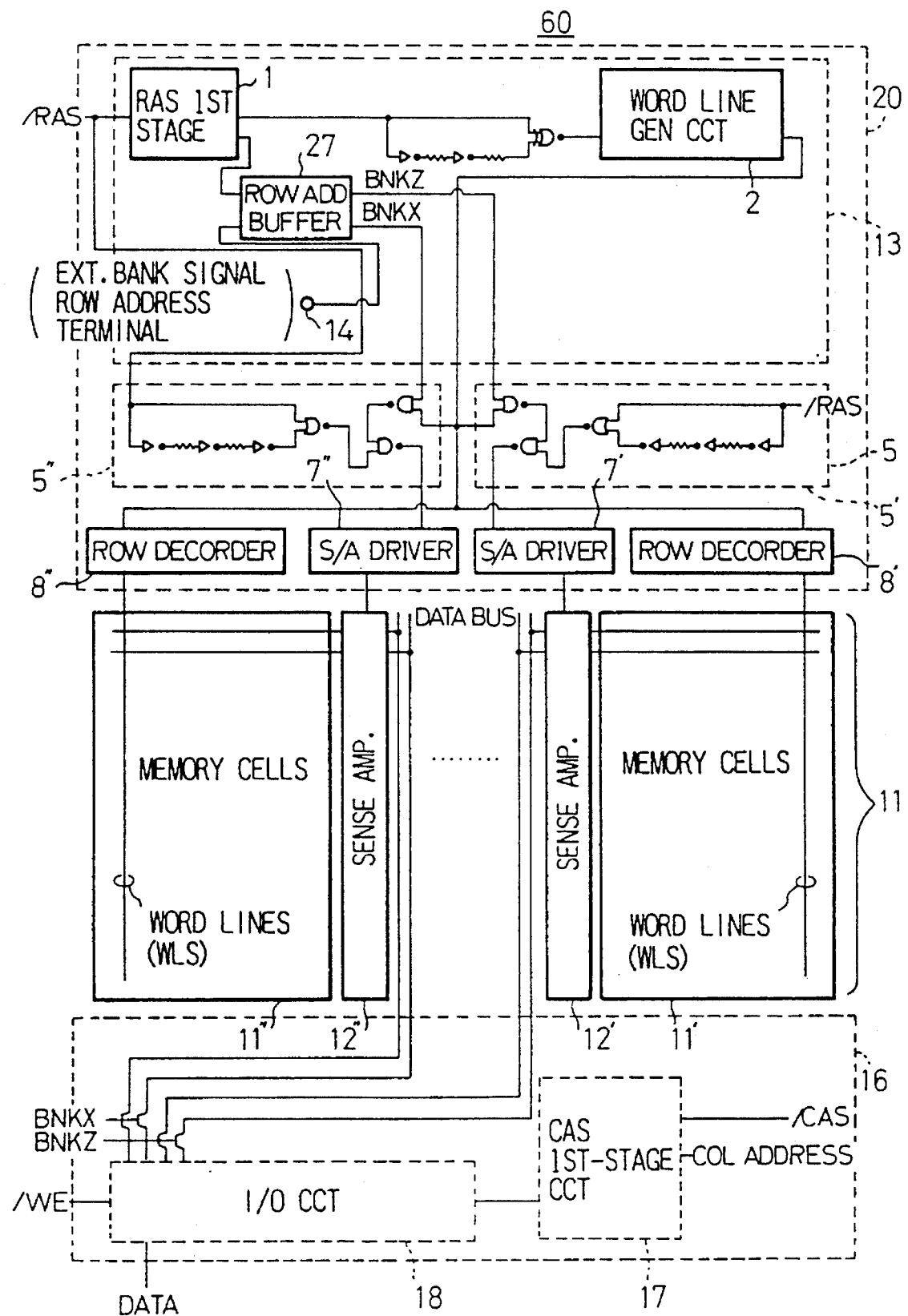
FIG. 10 is a block diagram illustrating the whole constitution of the sense amplifier control circuit according to the third embodiment of the present invention.

As shown in the block diagrams in FIGS. 9 and 10, the third embodiment of the present invention is concerned with a sense amplifier control circuit 60 in a dynamic random access memory (DRAM) which comprises at least a memory cell means 11, sense amplifiers 12, a /RAS signal input means 1, a word line (WL) boost signal-generating means 2, a sense amplifier control signal-generating means 5 and a sense amplifier drive signal-generating means 7 in order to read cell data by activating the word lines (WL) by utilizing row address strobe (/RAS) signals, wherein said memory cell means 11 is constituted by a plurality of banks 11', 11", said sense amplifiers are provided in a plurality of numbers 12', 12", said sense amplifier control signal-generating means 5 are provided in a plurality of numbers 5', 5" to correspond to the plurality of banks 11', 11", said word line (WL) boost signal-generating means 2 is so constituted as to activate the word lines (WL) by one shot pulse in synchronism with the rising and falling edges of the /RAS signals, and said sense amplifier control signal-generating means 5 are so constituted as to activate the sense amplifiers in synchronism with bank address signals that are derived from said /RAS signals.

In this embodiment, the word line (WL) rises and falls in response to the /RAS signals in the same manner as the activation and de-activation operations of the word line (WL) in the first embodiment shown in FIG. 1. Unlike the operation of FIG. 1, however, the sense amplifier is activated and de-activated by utilizing the /RAS signal and the external bank address.

FIGS. 9 and 10 are block diagrams illustrating the constitution of the sense amplifier control circuit 60 according to the third embodiment of the present invention in a dynamic random access memory (DRAM) which comprises at least a memory cell means 11, sense amplifiers 12, a /RAS signal input means 1, a word line (WL) boost signal-generating means 2, a sense amplifier control signal-generating means 5 and a sense amplifier drive signal-generating means 7, in order to read cell data by activating the word lines (WL) by utilizing row address strobe (/RAS) signals, wherein said memory cell means 11 is constituted by a plurality of banks 11', 11", said sense amplifiers are provided in a plurality of numbers 12', 12" to correspond thereto, said sense amplifier control signal-generating means 5 are provided in a plurality of numbers 5', 5" to correspond to the plurality of banks 11', 11", and provision is made of external sense amplifiers which are connected to said sense amplifier control signal-generating means 5', 5" in order to activate the sense amplifiers 12', 12" independently of the /RAS signals.

FIG. 9 is a block diagram illustrating the constitution of the sense amplifier control circuit 60 according to the present invention, wherein the same constituent elements as those of FIG. 12 are denoted by the same reference numerals as those of FIG. 12.

FIG. 10 is a block diagram which schematically illustrates the whole system constitution of the sense amplifier control circuit 60 according to the third embodiment of the present invention that is shown in FIG. 9.

As will be understood from FIG. 10, the sense amplifier control circuit 60 according to the third embodiment of the present invention is provided with the same column address control circuit 16 as that of FIG. 2.

The sense amplifier control circuit 60 according to the present invention is constituted, as shown in FIGS. 9 and 10, by the RAS circuit 20, the memory circuit 11 made up of a plurality of banks 11', 11" and sense amplifiers 12', 12" corresponding to the banks 11', 11", and the column address control circuit 16. Moreover, the RAS circuit 20 is constituted by the RAS first-stage circuit 13, first sense amplifier control signal-generating circuit 5', second sense amplifier control signal-generating circuit 5", first row decoder 8' that controls the first bank 11', first sense amplifier drive signal-generating circuit 7' that controls the first sense amplifier 12', second row decoder 8" that controls the second bank 11" and second sense amplifier drive signal-generating circuit 7" that controls the second sense amplifier 12".

The RAS first-stage circuit 13 in the sense amplifier control circuit 60 according to the third embodiment of the present invention includes a RAS signal first-stage input circuit 1 as the /RAS signal input means 1. Further, the external bank signal row address that determines which one should be selected out of the plurality of banks and the output of the RAS signal first-stage input circuit 1 are input to the row address buffer 27 which outputs predetermined internal bank signals BNKX and BNKZ that will be separately input to the first and second sense amplifier control signal-generating means 5' and 5".

The external bank signal according to the present invention is an address signal of the bank which may be the same as the /RAS signal.

According to the third embodiment of the present invention, the sense amplifier control signal-generating means 5 are provided in a number that corresponds to the number of the banks as in the aforementioned embodiments. That is, in this embodiment which has two banks, there are provided the first and the second sense amplifier control signal-generating means 5', 5" as shown in FIGS. 9 and 10.

The first and the second sense amplifier control signal-generating means 5', 5" include a suitable one shot pulse-generating means.

Then, the first and second sense amplifier drive signal-generating means 7', 7" are selected in order that the predetermined bank is activated by the sense amplifier control signal-generating means 5', 5" in response to the above-mentioned predetermined internal bank signal BNKX, BNKZ and a bank address formed by the /RAS signal.

Operation of the sense amplifier control circuit 60 according to the third embodiment of the present invention will now be described with reference to the waveform diagram of FIG. 11.

Figure 11:
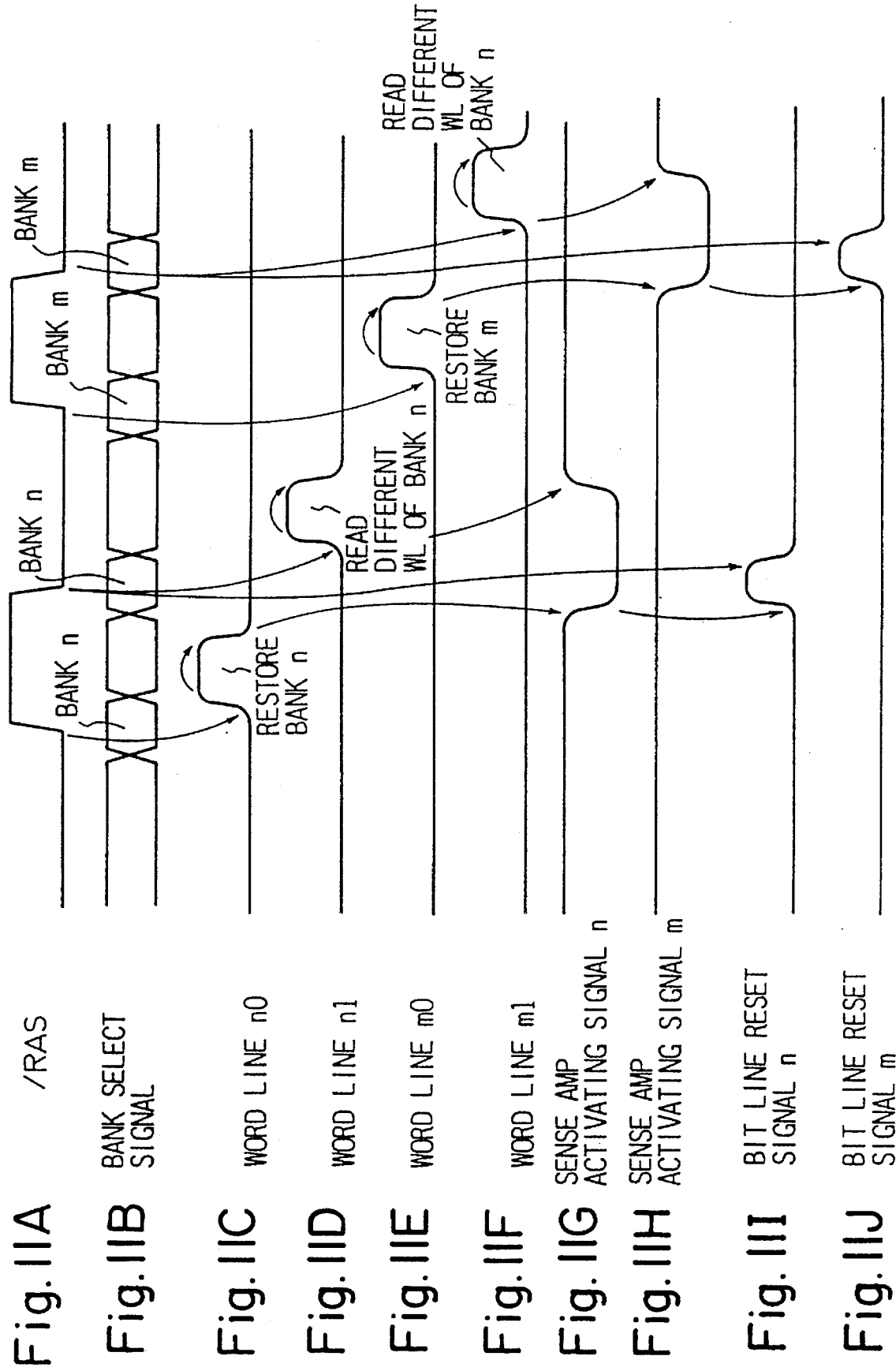
FIGS. 11A–11J is a diagram of waveforms illustrating the operation of the sense amplifier control circuit according to the third embodiment of the present invention.

Referring first to FIG. 11, n and m of the bank select signals may be addresses representing different banks or may be different chips.

The word line (WL) n0 is part of the word line (WL) in a bank n, and the word line (WL) n1 is part of the other word line (WL) in the same bank n.

Similarly, the word line (WL) m0 is part of the word line (WL) in a bank m, and the word line (WL) m1 is part of the other word line (WL) in the same bank m.

Under such a condition, a predetermined word line (WL) n0 in the selected bank is activated by one shot pulse due to the rise of the /RAS signal and, at this time, the internal sense amplifier activating signal n is activated upon receipt of the external bank n address signal and the rise of the word line (WL).

Owing to the provision of the bank address latch circuit, the internal sense amplifier activating signal n maintains the active condition even when the word line (WL) that is generated by one shot pulse is de-activated, and, hence, the data is held by the sense amplifier.

The word line (WL) is activated again by the one shot pulse in compliance with an address due to the rise of the /RAS signal. Upon the rise of the word line (WL) and the external bank m address, the internal sense amplifier activating signal m is de-activated and the sense amplifier is reset.

Describing the embodiment in further detail, when the rising /RAS signal and a bank select signal of the external bank signal have selected, for example, n of the bank so that the row address is n0, the word line (WL) n0 of the bank n rises and is then permitted to fall after the passage of a predetermined period to perform a one-shot pulse operation.

Such an operation is called restoration (rewriting). Though the data has been input to the sense amplifier in this stage, the word line (WL) has not yet been activated and no data is written onto the cell.

An operation is therefore necessary to write the data onto the cell from the sense amplifier by activating the word line (WL). The above-mentioned operation is intended to execute this operation.

The sense amplifier activating signal n of the bank n is de-activated in response to the fall of the one-shot pulse on the word line (WL) n0 in the bank n, and the condition is established to read the word line (WL).

Then, as the /RAS signal falls, the other word line (WL) n1 is selected in the bank n, when the address is n1, in the condition where the bank select signal is still specifying the bank n. Therefore, the word line (WL) n1 performs a one-shot pulse operation and the data of the word line (WL) n1 is read out.

The sense amplifier activating signal n of the bank n is activated after a predetermined delay time from the rise of the word line (WL) n1, and the data that is read out is held in the sense amplifier.

On the other hand, a bit line of the bank n is activated by the one-shot pulse operation when the sense amplifier activating signal n of the bank n is de-activated before the word line (WL) n1 performs the one-shot pulse operation. Thus, a predetermined bit line is reset.

That is, in this embodiment, the word line (WL) is activated by the one-shot pulse operation either when the /RAS signal is raised or fallen.

The same operation is executed for bank m. That is, when the bank select signal is specifying the bank m when the /RAS signal rises and when the address is specifying the word line (WL) m0, the word line (WL) m0 of the bank m is restored. Next, when the bank select signal is still specifying the bank m when the /RAS signal falls and when the address is specifying the word line (WL) m1, the word line (WL) m1 is selected and performs a one-shot pulse operation. At the same time, the data of the word line (WL) m1 is read out.

The other waveforms are the same as those in the case of bank n and are not described here.

In the sense amplifier control circuit in a DRAM which employs a bank system using a plurality of banks according to the present invention as described above, a circuit for activating the word lines (WL) in the DRAM is commonly used, and the word line (WL) activating function and the sense amplifier activating function are so constituted that they can be driven independently of each other. Therefore, the sense amplifier activating function is activated without being controlled by a predetermined /RAS signal and, as required, the sense amplifier activating function is maintained in the activated condition to hold the necessary data. When the same data or the data having a predetermined relationship to the above data are to be read out, the time for executing the arithmetic processing can be greatly shortened.

According to the present invention which uses a plurality of banks, furthermore, it is allowed to maintain a bank activated, i.e., to maintain predetermined data while exchanging data to other banks. It is further allowed to extend the period for activating the sense amplifiers up to a period which is equal to a maximum refreshing time in the DRAM, giving a margin to the arithmetic processing operation.

That is, according to the present invention, the word line (WL) activating function and the sense amplifier activating function work independently from each other in a DRAM having a plurality of banks such as in a Rambus DRAM in order to extend the sense amplifier active period up to the refresh time. Moreover, a single word line (WL) activating circuit is employed for the plurality of banks in order to execute access at high speeds.

Figure 14:
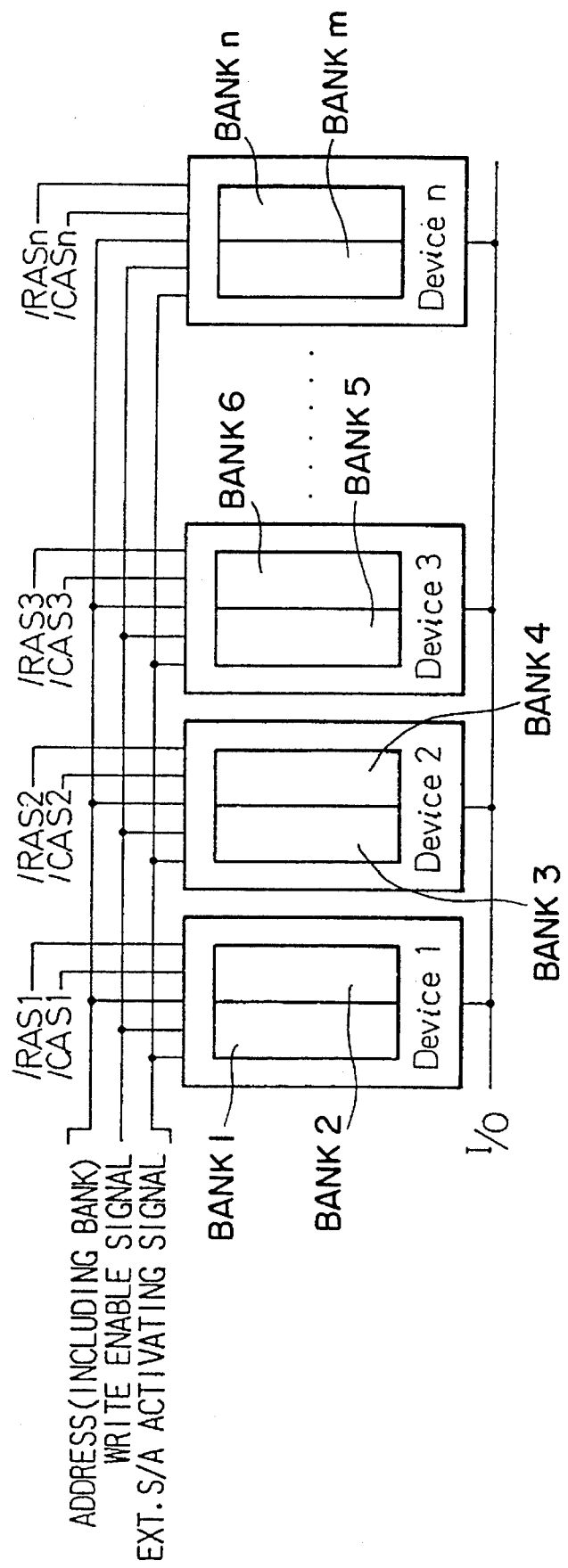
FIG. 14 is a block diagram illustrating the system constitution of the sense amplifier control circuit according to the first embodiment of the present invention.
Figure 15:
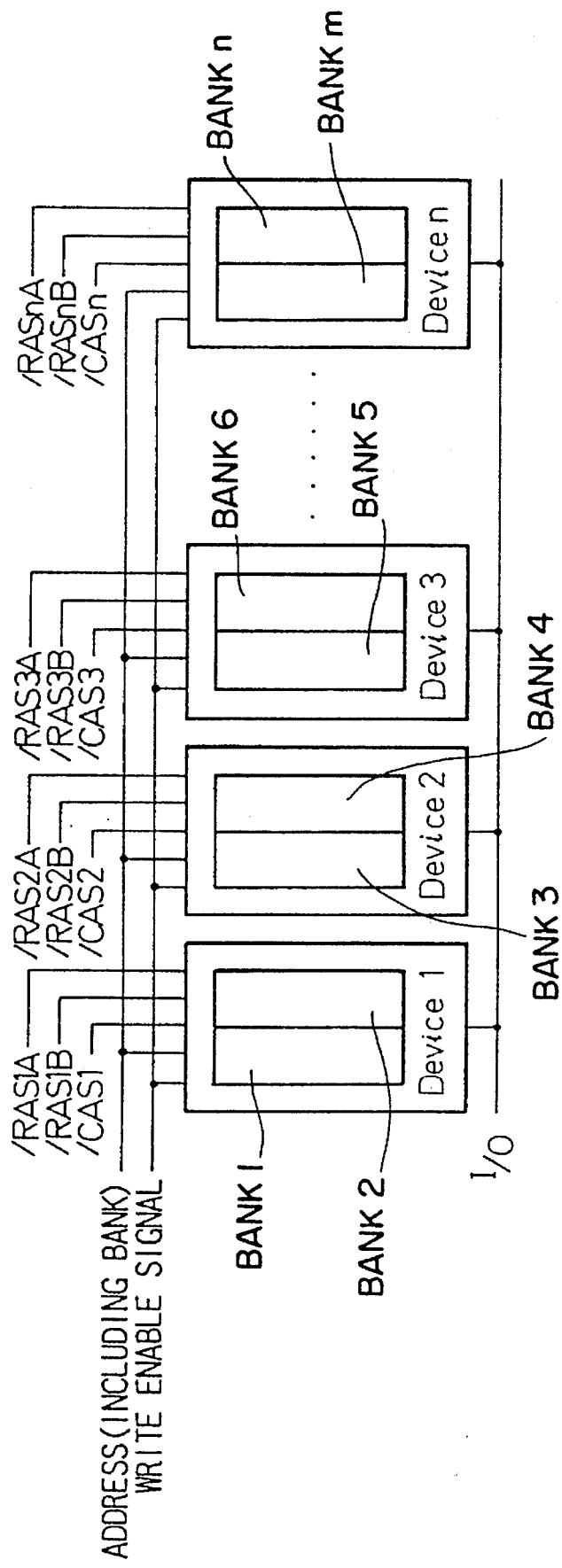
FIG. 15 is a block diagram illustrating the system constitution of the sense amplifier control circuit according to the second embodiment of the present invention.
Figure 16:
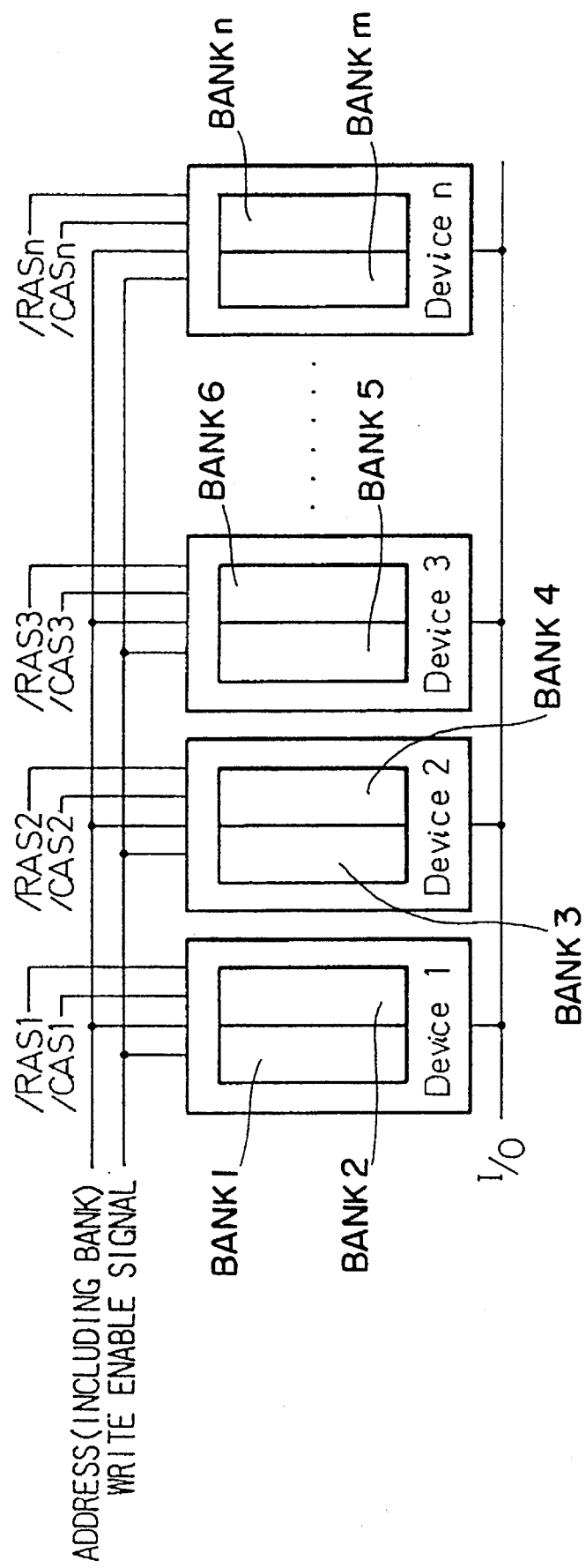
FIG. 16 is a block diagram illustrating the system constitution of the sense amplifier circuit according to the third embodiment of the present invention.

FIGS. 14 to 16 illustrate the system constitutions according to the first to third embodiments of the present invention, wherein FIG. 14 illustrates the system constitution according to the above-mentioned first embodiment.

In the drawings, there are provided a plurality of devices or chips 1 to n, each of the devices or the chips being provided with two banks.

A predetermined bank is selected by the /RAS signal and the bank address, the word line (WL) in the selected bank is activated, and the sense amplifier is activated by an external sense amplifier activating signal.

FIG. 15 illustrates the system constitution according to the second embodiment which controls the bank relying upon a plurality of /RAS signals.

In the drawing, there are provided a plurality of devices or chips 1 to n, each of the devices or the chips being provided with two banks.

A predetermined bank is selected by a plurality of /RAS signals and by a bank address, and the word line (WL) in the selected bank is activated to activate the sense amplifier.

FIG. 16 illustrates the system constitution according to the third embodiment which controls the bank using a bank address only.

In the drawing, there are provided a plurality of devices or chips 1 to n, each of the devices or the chips being provided with two banks.

A predetermined bank is selected by a /RAS signal and a bank address, and the word line (WL) in the selected bank is activated to activate the sense amplifier.

We claim:

1. A dynamic random access memory (DRAM) comprising:

a /RAS signal input unit inputting a row address strobe (/RAS) signal;

a plurality of memory cells selected by word lines and bit lines;

sense amplifiers connected to each one of said bit lines;

a word line (WL) boost signal-generating circuit activating at least one of said word lines, in response to an input of the row address strobe (/RAS) signal; and a sense amplifier control signal-generating circuit, coupled to said word line (WL) boost signal-generating circuit, controlling said sense amplifiers to activate or deactivate said sense amplifiers, in response to said row address strobe (/RAS) signal and an external sense amplifier activating signal output from an external sense amplifier activating signal generating circuit, wherein said external sense amplifier activating signal generating circuit maintains said sense amplifier under the active condition when said row address strobe (/RAS) signal is de-activated.

2. A dynamic random access memory (DRAM) according to claim 1, wherein said external sense amplifier activating signal generating circuit is connected to said sense amplifier control signal-generating circuit.

3. A dynamic random access memory (DRAM) according to claim 2, wherein said external sense amplifier activating signal output from said external sense amplifier activating signal generating circuit serves to activate said sense amplifier independently of said row address strobe (/RAS) signal.

4. A dynamic random access memory (DRAM) according to claim 3, wherein said external sense amplifier activating signal includes said row address strobe (/RAS) signal.

5. A dynamic random access memory (DRAM) according to claim 1, wherein said plurality of memory cells are divided into a plurality of groups, each group constituting a bank.

6. A dynamic random access memory (DRAM) comprising:

memory cell means for storing cell data, wherein said memory cell means includes a plurality of banks selected by word lines and bit lines, sense amplifiers connected to each one of said bit lines;

row address strobe (/RAS) signal input means for inputting a row address strobe (/RAS) signal;

word line (WL) boost signal-generating means for reading cell data by activating at least one of said word lines in response to an input of the row address strobe (/RAS) signal;

a plurality of sense amplifier control signal-generating means, coupled to said word line (WL) boost signal-generating means, controlling said sense amplifiers to activate or deactivate said sense amplifiers, in response to said row address strobe (/RAS) signal and an external sense amplifier activating signal output from an external sense amplifier activating signal generating circuit, wherein each of said sense amplifier control signal-generating means corresponds to each of the banks, and wherein said external sense amplifier activating signal generating circuit is connected to each of said sense amplifier control signal-generating means to activate said sense amplifiers independently of said row address strobe (/RAS) signal.

* * * * *